United States Patent
Zhang et al.

(10) Patent No.: US 11,709,393 B2
(45) Date of Patent: Jul. 25, 2023

(54) LIGHT-EMITTING DIODE ADOPTING A MULTI-COLOR LIGHT EMITTING CHIP AND BACKLIGHT-TYPE DISPLAY DEVICE INCLUDING THE LIGHT-EMITTING DIODE

(71) Applicant: KAISTAR Lighting (Xiamen) Co., Ltd., Xiamen (CN)

(72) Inventors: Jingqiong Zhang, Xiamen (CN); Changwen Liao, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 17/499,124

(22) Filed: Oct. 12, 2021

(65) Prior Publication Data

US 2022/0128861 A1    Apr. 28, 2022

(30) Foreign Application Priority Data

Oct. 23, 2020   (CN) .......................... 202011149368.6

(51) Int. Cl.
*G02F 1/13357*    (2006.01)
*H01L 33/06*    (2010.01)
(Continued)

(52) U.S. Cl.
CPC ...... *G02F 1/133603* (2013.01); *C09K 11/617* (2013.01); *H01L 33/06* (2013.01);
(Continued)

(58) Field of Classification Search
CPC ... G02F 1/133603; H01L 33/06; H01L 33/32; H01L 33/502; H01L 33/62
See application file for complete search history.

(56) References Cited

U.S. PATENT DOCUMENTS

2016/0372638 A1*  12/2016  Todorov ................ H01L 33/504
2017/0115529 A1*   4/2017  Kim ...................... G02F 1/1336
(Continued)

FOREIGN PATENT DOCUMENTS

CN    101999169 B    * 12/2013    ......... H01L 25/0753
CN    107170866 A       9/2017
(Continued)

OTHER PUBLICATIONS

CN107170866, manual translation (Year: 2019).*
(Continued)

*Primary Examiner* — Tracie Y Green
(74) *Attorney, Agent, or Firm* — Zhigang Ma (57) ABSTRACT

A light-emitting diode (LED) and a backlight-type display device are provided. The light-emitting diode includes: a multi-color light emitting chip, an emission spectrum thereof including a first peak in a wavelength range of a first primary-color light and a second peak in a wavelength range of a second primary-color light, and an absolute value of a wavelength difference between the first and second peaks being greater than 50 nm; and a phosphor-containing layer, disposed over the multi-color light emitting chip and used to be excited to emit a third primary-color light. Owing to the LED adopts the multi-color light emitting chip which has the first and second peaks in different wavelength ranges and the absolute valve of the wavelength difference is greater than 50 nm, RGB three-primary-color lights can be outputted by adopting a single-color light phosphor powder with relatively high reliability. The backlight-type display device can obtain a high NTSC level.

18 Claims, 8 Drawing Sheets

(51) Int. Cl.
    *H01L 33/32*    (2010.01)
    *H01L 33/50*    (2010.01)
    *H01L 33/62*    (2010.01)
    *C09K 11/61*    (2006.01)
(52) U.S. Cl.
    CPC ............ *H01L 33/32* (2013.01); *H01L 33/502* (2013.01); *H01L 33/62* (2013.01)

(56)  References Cited

U.S. PATENT DOCUMENTS

2018/0374988 A1* 12/2018 Mi ......................... H01L 33/06
2020/0313048 A1* 10/2020 Yao ....................... H01L 33/504

FOREIGN PATENT DOCUMENTS

CN          107946434 A      4/2018
WO      WO-2020210740 A1 * 10/2020   ........... G02B 6/0068

OTHER PUBLICATIONS

CN112271239A_first office action, English translation (dated 2021).*
Yao et al., CN107946434A, machine translation Jul. 2018 (Year: 2018).*

* cited by examiner

LIGHT-EMITTING DIODE ADOPTING A MULTI-COLOR LIGHT EMITTING CHIP AND BACKLIGHT-TYPE DISPLAY DEVICE INCLUDING THE LIGHT-EMITTING DIODE

FIELD OF THE DISCLOSURE

The disclosure relates to the field of light source and display technologies, and more particularly to a light-emitting diode and a backlight-type display device.

BACKGROUND OF THE DISCLOSURE

LEDs (light-emitting diodes) as light-emitting elements can be applied to RGB three-primary-color direct displays, direct-lit backlight sources (also referred to as direct-type backlight sources) and edge-lit backlight sources (also referred to as edge-type backlight sources). The RGB three-primary-color direct display has relatively best display effect but a relatively high cost. Compared with the edge-lit backlight source, the direct-lit backlight source can make a backlight-type display device (such as liquid crystal display device) have better picture quality, and can better realize a partition and achieve a higher contrast. However, resulting from the light source is relatively thick, the direct-lit backlight source is unfavorable for lightness and thinness of products.

For backlight-type display devices equipped with backlight sources, due to relatively poor display effects, NTSC (National Television Standard Committee) levels of different phosphor solutions are significantly different. In a general technical specification of mini-LED commercial display screens, color gamut coverages (Gp) in NTSC mode are classified into three levels of ABC, including: level A, Gp≥90%, level B, 72%≤Gp<90%, and level C, Gp<72%. A green-light phosphor solution with a relatively high NTSC level generally uses silicate or β-SiAlON, but prices of such phosphors are relatively high, the silicate green-light phosphor has a relatively poor reliability in high temperature and humidity environment, an excitation efficiency of the β-SiAlON green-light phosphor in the blue-light band is relatively low, and other green-light phosphors whose emission spectra are not narrow enough have limitations for improving NTSC levels. Therefore, how to reduce the usage of phosphor with relatively low reliability while maintaining a high NTSC level is a technical problem to be solved.

SUMMARY OF THE DISCLOSURE

Accordingly, embodiments of the disclosure provide a light-emitting diode (LED) and a backlight-type display device. By way of designing an emission spectrum of the light-emitting diode, the usage of phosphor with relatively low reliability can be reduced while still maintaining a high NTSC level.

Specifically, an embodiment of the disclosure provides a light-emitting diode exemplarily including: a multi-color light emitting chip and a phosphor-containing layer. An emission spectrum of the multi-color light emitting chip includes a first peak in a wavelength range of a first primary-color light, and a second peak in a wavelength range of a second primary-color light; and an absolute value of a wavelength difference between the first peak and the second peak is greater than 50 nanometers (nm). The phosphor-containing layer is disposed covering/over the multi-color light emitting chip and configured (i.e., structured and arranged) to be excited (e.g., by light emitted from the multi-color light emitting chip) to emit a third primary-color light. Colors of the third primary-color light, the second primary-color light, and the first primary-color light are different from one another.

In an embodiment of the disclosure, a wavelength of the first peak is in a range of 430 nm~470 nm, and a wavelength of the second peak is in a range of 515 nm~535 nm.

In an embodiment of the disclosure, an intensity of the first peak is greater than an intensity of the second peak, a wavelength of the first peak is less than a wavelength of the second peak, and a spectral full width half maximum (FWHM) of the emission spectrum corresponding to the first peak and a spectral FWHM of the emission spectrum corresponding to the second peak each are less than 50 nm.

In an embodiment of the disclosure, a ratio of the intensity of the first peak to the intensity of the second peak is in a range of 5/3~5, preferably in a range of 2~5.

In an embodiment of the disclosure, the spectral full width half maximum of the emission spectrum corresponding to the first peak is smaller than the spectral full width half maximum of the emission spectrum corresponding to the second peak, the spectral full width half maximum of the emission spectrum corresponding to the first peak is in a range of 15 nm~25 nm, and the spectral full width half maximum of the emission spectrum corresponding to the second peak is in a range of 25 nm~45 nm.

In an embodiment of the disclosure, the multi-color light emitting chip includes an N-type semiconductor layer, a P-type semiconductor layer, and a multiple quantum well layer structure located between the N-type semiconductor layer and the P-type semiconductor layer. The multiple quantum well layer structure includes a first well layer and a second well layer arranged along a distance direction of the N-type semiconductor layer and the P-type semiconductor layer. The first well layer and the well layer have different band gaps and are configured for emitting the first primary-color light and the second primary-color light respectively.

In an embodiment of the disclosure, a material of each of the first well layer and the second well layer includes indium gallium nitride, and a concentration of indium in the first well layer is different from a concentration of indium in the second well layer. The concentration of indium in the first well layer is in a concentration range of 12.4%~18.8%, and the concentration of indium in the second well layer is in a concentration range of 25.2%~27.8%.

In an embodiment of the disclosure, the light-emitting diode is a chip-scale packaged single-chip device, and the multi-color light emitting chip is a flip chip. The phosphor-containing layer is located on a top surface of the flip chip and arranged around (e.g., on four side surfaces of) the flip chip, so as to realize light output from side surfaces as well as the top surface of the light-emitting diode. Or, the phosphor-containing layer is located on the top surface of the flip chip and a white glue is arranged around (e.g., on four side surfaces of) the flip chip, so as to realize light output from only the top surface of the light-emitting diode.

In an embodiment of the disclosure, the light-emitting diode is surface-mounted single-chip device and further includes a packaging substrate. The packaging substrate is formed with a recessed region. The multi-color light emitting chip is arranged in the recessed region and electrically connected to the packaging substrate. The phosphor-containing layer is filled in the recessed region to cover the multi-color light emitting chip, and the multi-color light emitting chip may be a lateral chip or a flip chip Furthermore, another embodiment of the disclosure provides a backlight-type display device including: a display panel and a backlight module. The display panel includes a first primary-color filter, a second primary-color filter and a third primary-color filter. The backlight module is configured for providing backlight illumination to the display panel. The backlight module is provided with the light-emitting diode as described in any one of the above embodiments. The first primary-color filter, the second primary-color filter and the third primary-color filter are configured for filtering the first primary-color light, the second primary-color light and the third primary-color light respectively.

The above technical solutions of the disclosure may have one or more of advantages or benefits as follows. In one hand, the light-emitting diode as described in any one of the embodiments of the disclosure adopts a multi-color light emitting chip, the multi-color light emitting chip has a first peak in the wavelength range of the first primary-color light (such as in blue light waveband) and a second peak in the wavelength range of the second primary-color light (such as in green light waveband), and the absolute value of the wavelength difference between the first peak and the second peak is greater than 50 nm, so that RGB three-primary-color lights can be outputted by adopting a single-color light phosphor (such as red-light phosphor) with relatively high reliability. In another hand, when the light-emitting diode combines RGB three-primary-color filters to be used/applied into a backlight-type display device such as a liquid crystal display device, a high NTSC level can be achieved.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative effort.

DETAILED DESCRIPTION OF EMBODIMENTS

The specific structures and functional details disclosed herein are merely illustrative and for the purpose of describing exemplary embodiments of the disclosure. However, the disclosure may be embodied by many alternative forms, and thus should not be construed as being limited only to the embodiments illustrated/described herein.

In the description of the disclosure, it should be understood that orientations or position relationships indicated by terms "center", "transverse", "upper", "lower", "left", "right", "vertical", "horizontal", "top", "bottom", "inner", "outer" and so on are based on orientations or position relationships shown in the attached/accompanying drawings, which are merely for the convenience of describing the disclosure and simplifying the description, rather than indicating or implying that the device or component referred to must have a specific orientation and must be constructed and operated in the specific orientation, and thus the orientations or position relationships should not be understood as limitations to the disclosure. Furthermore, terms "first", "second" are used only for descriptive purposes, and cannot be understood as indicating or implying relative importance or implicitly indicating the numbers/amounts of technical features indicated. Therefore, a feature limited by the terms "first" and "second" may explicitly or implicitly include one or more the features. In the description of the disclosure, unless otherwise stated, "multiple/plurality" means two or more than two. In addition, the term "including" and any deformation thereof are intended to cover nonexclusive inclusion.

In the description of the disclosure, it should be noted that unless otherwise clearly specified and defined, terms "installing", "connecting" and "coupling" shall be broadly understood, for example, which can be understood as: fixed connection, detachable connection or integrated/integral connection; mechanical connection or electrical connection; or, direct connection, indirect connection through an intermediate medium or internal communication of two components. For the ordinary technicians in the art, the specific meanings of the above terms in the disclosure may be understood according to specific situations.

The terms used herein are only for the purpose of describing specific embodiments and are not intended to limit exemplary embodiments. Unless the context clearly indicates otherwise, the singular forms "a" and "an" used herein are also intended to include plural/multiple. It should also be understood that the terms "including" and/or "containing" used herein specify the existence of stated features, integers, steps, operations, units and/or components without excluding the existence or addition of one or more other features, integers, steps, operations, units, components and/or combinations thereof.

First Embodiment

Figure 1A:
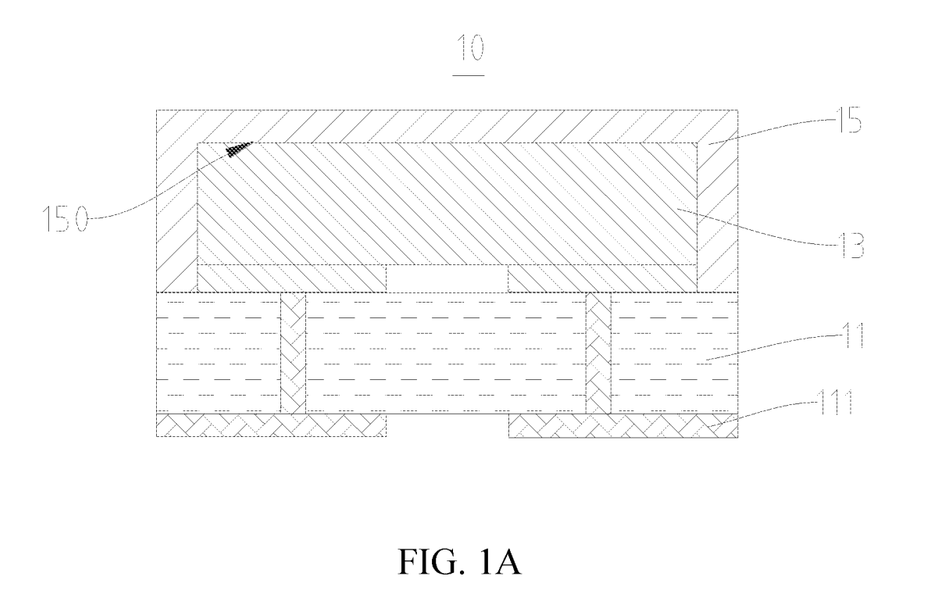
FIG. 1A is a schematic structural view of a light-emitting diode according to a first embodiment of the disclosure.

Referring to FIG. 1A, the first embodiment of the disclosure provides a light-emitting diode (LED) 10. The light-emitting diode 10 may include: a packaging substrate 11, a multi-color light emitting chip 13, and a phosphor-containing layer (also referred to as wavelength conversion layer) 15.

The packaging substrate 11, for example, includes a base (such as ceramic base) and a circuit structure 111 arranged on the base. Specifically speaking, the circuit structure 111 includes: a positive electrode and a negative electrode arranged on a bottom surface of the base, and multiple (i.e., more than one) vias penetrating through the base and being electrically connected to the positive electrode and the negative electrode respectively.

The multi-color light emitting chip 13 is arranged on the packaging substrate 11. The multi-color light emitting chip 13 is electrically connected to the circuit structure 111 on the packaging substrate 11. Specifically speaking, the multi-color light emitting chip 13, for example, is single light-emitting diode chip, and thus the light-emitting diode 10 is a single-chip device. The multi-color light emitting chip 13 is a flip chip, a P-type electrode and an N-type electrode thereof are located at a top surface of the base and electrically connected to the multiple vias respectively, so as to achieve electrical connections with the positive electrode and the negative electrode. Of course, it can be understood that, the light-emitting diode 10 of the illustrated embodiment may adopt a plurality of the multi-color light emitting chips 13 instead in other embodiment, and thereby forms a multi-chip device.

The phosphor-containing layer 15 acting as a wavelength conversion element is arranged on the packaging substrate 11. The phosphor-containing layer 15 covers the multi-color light emitting chip 13 and is configured to be excited (e.g., by light emitted from the multi-color light emitting chip 13) to emit light. Specifically speaking, a side of the phosphor-containing layer 15 adjacent to the packaging substrate 11 has a recessed region 150. The multi-color light emitting chip 13 is located/received in the recessed region 150, so as to realize light output from side surfaces as well as the top surface of the light-emitting diode 10, thus obtaining a CSP (Chip Scale Package) structure of five-sided light output. In other words, the phosphor-containing layer 15 is located on a top surface of the multi-color light emitting chip 13 facing away from the packaging substrate 11 and further arranged around (e.g., on four side surfaces of) the multi-color light emitting chip 13. Moreover, the phosphor-containing layer 15 of the illustrated embodiment is typically a mixture of a transparent glue and a phosphor. The transparent glue is, for example, a silicone (having a relatively high transmittance to visible light), and the phosphor is, for example, a KSF phosphor or other phosphor which can be excited to emit red light. A color of the KSF phosphor itself is yellow, but the KSF phosphor will emit red light after being excited by blue light, and thus the KSF phosphor is also called as KSF red-light phosphor.

Figure 1B:
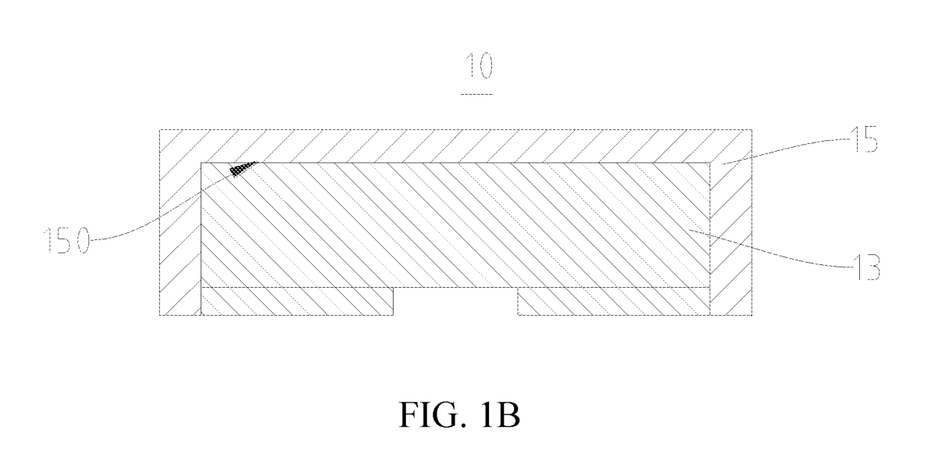
FIG. 1B is a schematic structural view of another light-emitting diode according to the first embodiment of the disclosure.

It is noted that, in other embodiment, as shown in FIG. 1B, the light-emitting diode 10 may not be equipped with the packaging substrate 11. For example, the multi-color light emitting chip 13 and the phosphor-containing layer 15 are firstly formed on a temporary/removable substrate and the removable substrate then is removed, to thereby obtain the light-emitting diode 10 as shown in FIG. 1 B.

Figure 2:
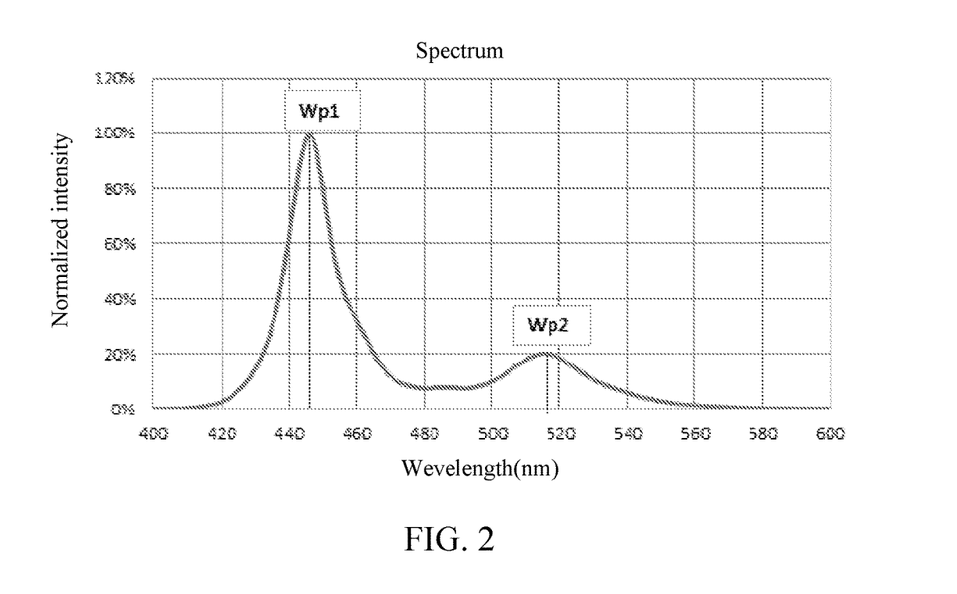
FIG. 2 is a schematic view of an emission spectrum of a multi-color light emitting chip of the light-emitting diode shown in FIG. 1A or 1B.

Referring to FIG. 2, an emission spectrum of the multi-color light emitting chip 13 of the illustrated embodiment exemplarily includes a first peak Wp1 in a wavelength range of a first primary-color light, and a second peak Wp2 in a wavelength range of a second primary-color light. An absolute value of a wavelength difference between the first peak Wp1 and the second peak Wp2 is greater than 50 nanometers (nm). Correspondingly, the phosphor-containing layer 15 is disposed covering the multi-color light emitting chip 13 and can be excited to emit a third primary-color light. Herein, the design that the absolute value of the wavelength difference is more than 50 nm is beneficial for blue/green light presenting a relatively high color purity after passing through a corresponding filter, and thus can improve the NTSC level.

As shown in FIG. 2, the wavelength of the first peak Wp1 is about 445 nm and belongs to a wavelength range of blue light. The wavelength of the second peak Wp2 is about 517 nm and belongs to a wavelength range of green light. It is noted that, the wavelength of the first peak Wp1 and the wavelength of the second peak Wp2 in the emission spectrum of the multi-color light emitting chip 13 of the illustrated embodiment are not limited to the values shown in FIG. 2, and can be other values instead. For example, the wavelength of the first peak Wp1 is in a range of 430 nm~470 nm (belonging to the wavelength range of blue light), and the wavelength of the second peak Wp2 is in a range of 515 nm~535 nm (belonging to the wavelength range of green light).

Furthermore, an intensity (e.g., normalized intensity) of the first peak Wp1 is greater than an intensity (e.g., normalized intensity) of the second peak Wp2. If the intensity of the first peak Wp1 is defined as 100%, the intensity of the second peak Wp2 is, for example, 20%-60%, and preferably 20%~50%, i.e., the intensity of the first peak Wp1 is twice or more of the intensity of the second peak Wp2, so that the intensity of the first peak Wp1 is much greater than that of the second peak Wp2. Correspondingly, a ratio of the intensity of the first peak Wp1 to that of the second peak Wp2 is in a range of 5/3~5, preferably is in a range of 2~5. Herein, the multi-color light emitting chip 13 capable of emitting blue light and green light is taken as an example, the green light would have a relatively low brightness due to a congenital/inherent defect of green gap, the KSF phosphor only can absorb blue light, the nitride red phosphor can be excited by blue and green light but an excitation efficiency of blue light is relatively higher. Therefore, the phosphor is excited by blue light would emit red light with better brightness, and preferably the intensity of the Wp1 is designed to be much greater than that of the Wp2. Furthermore, in the illustrated embodiment, a spectral full width half maximum (FWHM) of the emission spectrum corresponding to the first peak Wp1 is less than a spectral FWHM of the emission spectrum corresponding to the second peak Wp2. The spectral FWHM (such as blue light spectral FWHM) of the emission spectrum corresponding to the first peak Wp1 and the spectral FWHM (such as green spectral FWHM) of the emission spectrum corresponding to the second peak Wp2 each are designed to be less than 50 nm, the narrower of the FWHM, the higher the color purity, which would help to improve the NTSC level. Preferably, the spectral full width half maximum corresponding to the first peak Wp1 is in a range of 15 nm~25 nm, and the spectral full width half maximum corresponding to the second peak Wp2 is in a range of 25 nm~45 nm. In addition, it is noted that, through selection and control of the intensities of the first peak Wp1 and second peak Wp2 and their corresponding spectral FWHMs, a relatively high NTSC level can be ensured, and moreover, taking into account a dependence of white balance on a peak intensity ratio of respective color lights (the white balance is an indicator of an accuracy of a white generated by mixing three primary colors of red, green and blue, to ensure that colors in an image are as natural as possible), it can ensure a relatively high NTSC level while achieving a good white balance, thereby realizing good applications of light-emitting diodes in backlight-type display devices.

Figure 3:
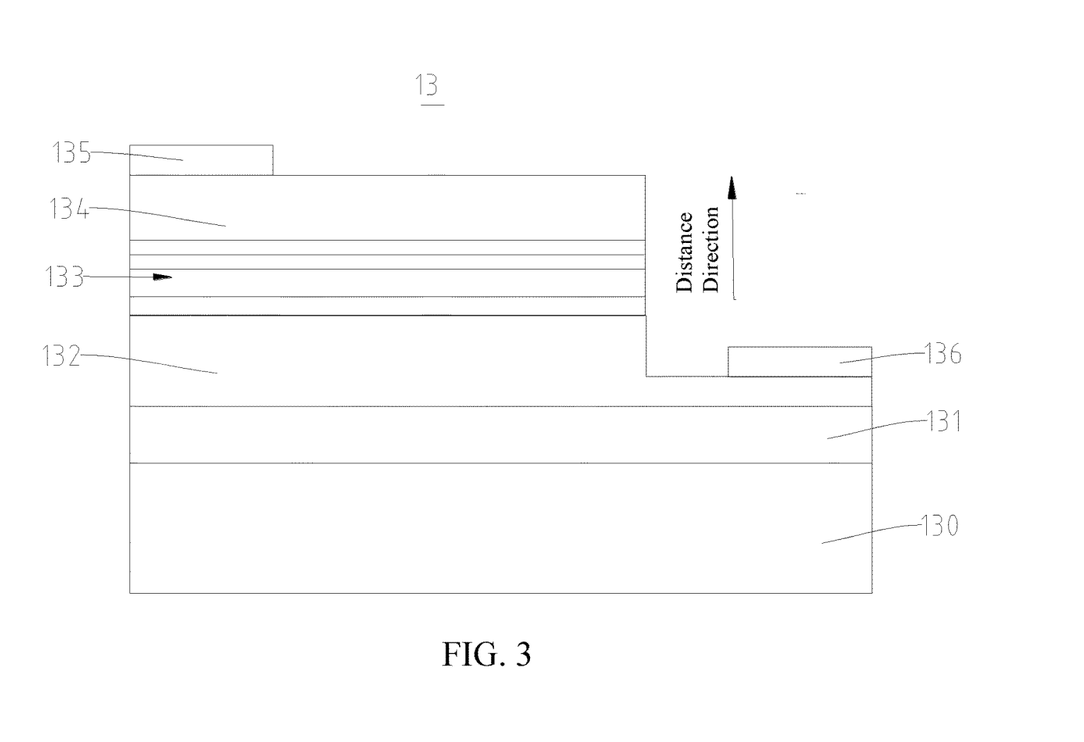
FIG. 3 is a schematic structural view of a multi-color light emitting chip of the light-emitting diode shown in FIG. 1A or 1B.
Figure 4:
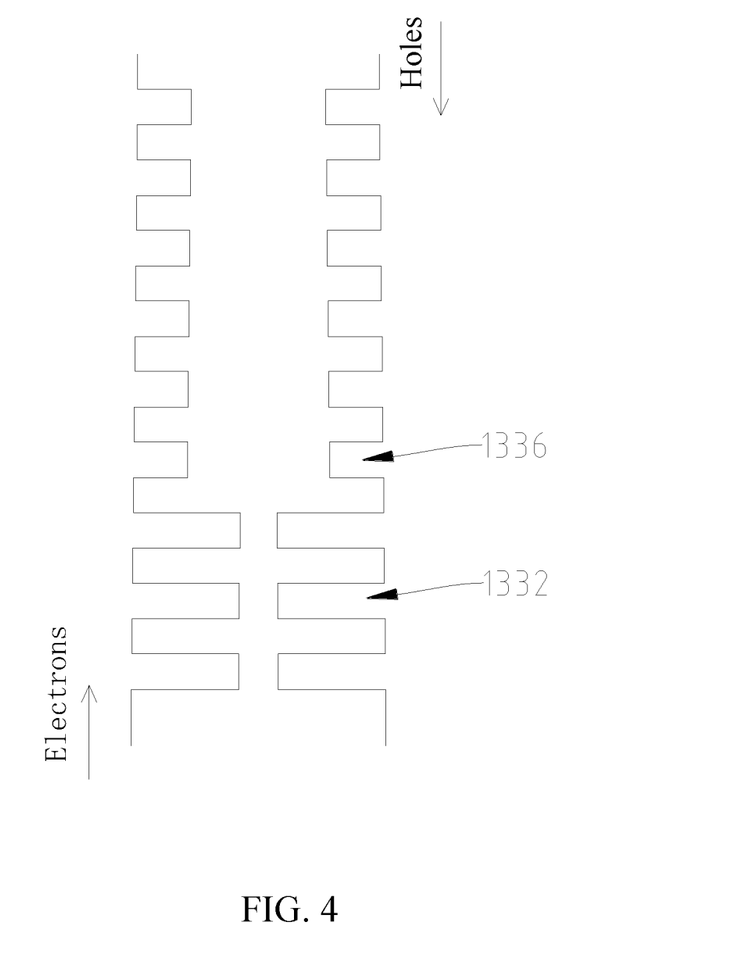
FIG. 4 is a schematic view of an energy gap arrangement of a multiple quantum well layer structure shown in FIG. 3.

Referring to FIG. 3, FIG. 3 is a schematic structural view of the multi-color light emitting chip 13 with the emission spectrum shown in FIG. 2. Specifically, as shown in FIG. 3, the multi-color light emitting chip 13 is, for example, a GaN-based (gallium nitride based) light-emitting diode chip. For example, the multi-color light emitting chip 13 includes a substrate 130, a GaN crystalline layer 131, an N-type GaN layer, a multiple quantum well layer structure 133, a P-type GaN layer 134, a P-electrode 135, and an N-electrode 136. The multiple quantum well layer structure 133 is located between the N-type GaN layer 132 and the P-type GaN layer 134. For example, the multiple quantum well layer structure 133 is composed of a barrier layer (gallium nitride (GaN) layer), and well layers (indium gallium nitride ($In_xGa_{1-x}N$) layers) 1332, 1336 (see FIG. 4). Because concentrations of indium in the respective well layers 1332, 1336 would affect band gaps of the well layers 1332, 1336, and therefore the band gaps of the respective well layers 1332, 1336 can be adjusted by controlling the concentrations of indium in the respective well layers 1332, 1336, thereby controlling light emission wavelengths of the respective well layers 1332, 1336. It is verified by the inventor's some experiments, a concentration range of indium corresponding to the wavelength range of blue light is 12.4%~18.8%, and a concentration range of indium corresponding to the wavelength range of green light is 25.2%~27.8%. In the illustrated embodiment, there are two kinds of band gaps in the multiple quantum well layer structure 133 of the multi-color light emitting chip 13 at the same time, and thus the multi-color light emitting chip 13 can emit the first primary-color light such as blue light and the second primary-color light such as green light. Moreover, the substrate 130 is exemplarily a sapphire substrate, and an ohmic contact layer like a Ni/Au layer or an ITO (Indium Tin Oxide) layer may be arranged between the P-type GaN layer 134 and the P-electrode 135. In addition, it is noted that the material of the well layers 1332, 1336 in the multiple quantum well layer structure 133 is not limited to indium gallium nitride, and can be other polycompound based on gallium nitride such as aluminum gallium nitride.

Figure 5:
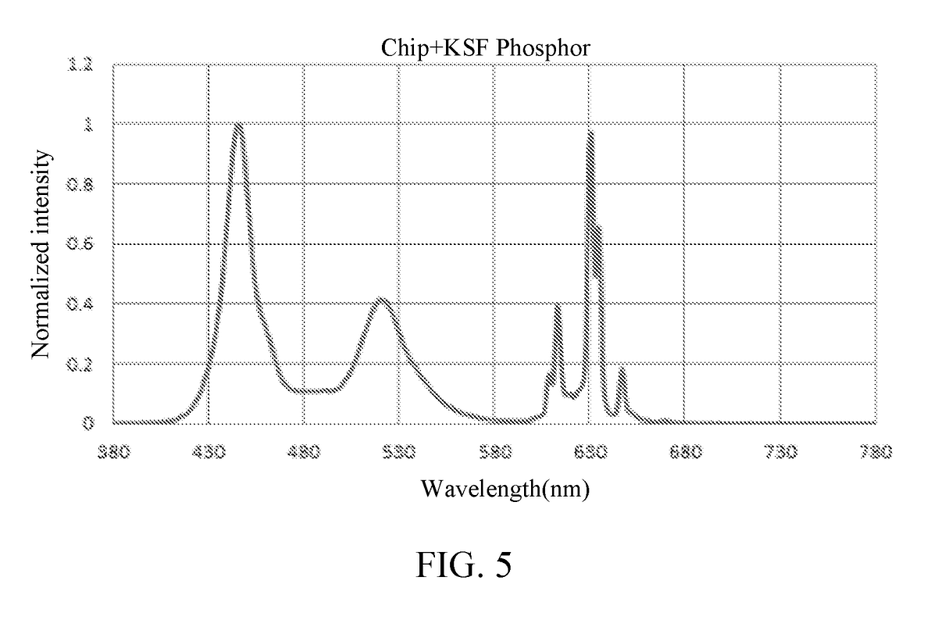
FIG. 5 is a schematic spectrum diagram of a multi-color light emitting chip of the LED shown in FIG. 1A or 1B in combination with a KSF phosphor.
Figure 6:
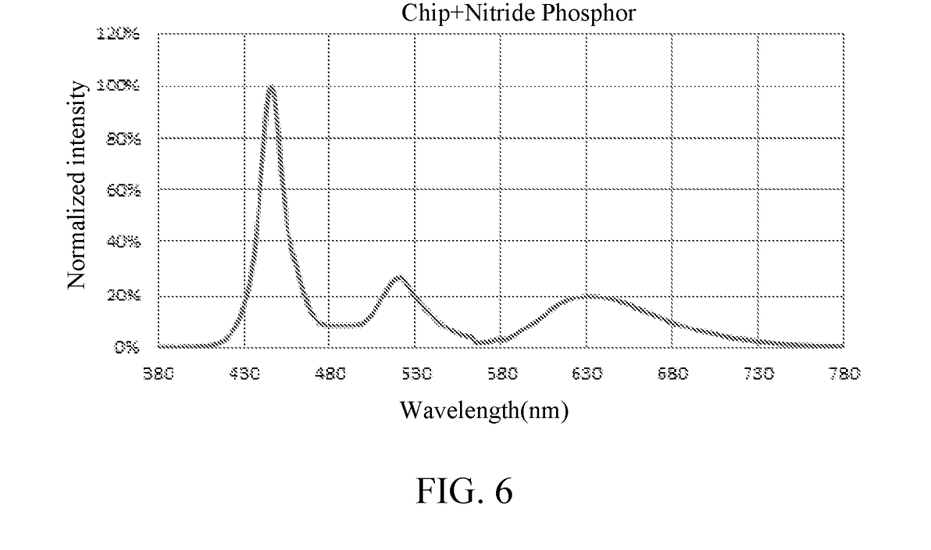
FIG. 6 is a schematic spectrum diagram of a multi-color light emitting chip of the LED shown in FIG. 1A or 1B in combination with a nitride phosphor.
Figure 7:
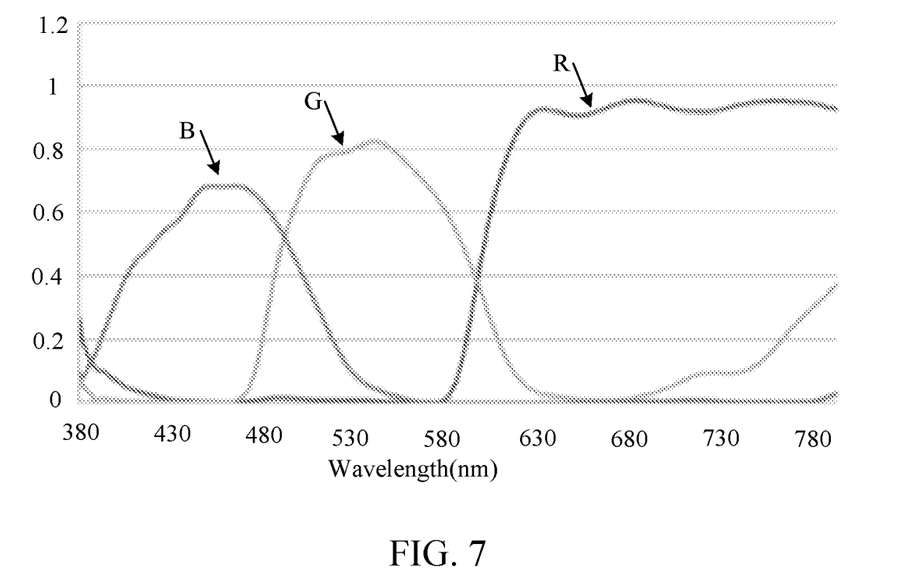
FIG. 7 is a schematic spectra diagram of the light-emitting diode shown in FIG. 1A or 1B in combination with RGB three-primary-color filters.

In the illustrated embodiment, the phosphor-containing layer 15 is disposed covering/over the multi-color light emitting chip 13. The phosphor contained in the phosphor-containing layer 15 is, for example, single-color light phosphor capable of being excited to emit red light (or called as red-light phosphor), and the single-color light phosphor can be a KSF (K2SiF6:Mn4+, fluoride containing tetravalent manganese) red-light phosphor with ultra-narrow band, or a nitride red-light phosphor with relatively narrow full width half maximum. Of course, it can be understood that the phosphor contained in the phosphor-containing layer 15 may be a mixture of multiple (i.e., more than one) red-light phosphors, but does not contain yellow/green light phosphor. FIG. 5 is a schematic spectrum diagram of the multi-color light emitting chip 13 in combination with a KSF red-light phosphor, and FIG. 6 is a schematic spectrum diagram of the multi-color light emitting chip 13 in combination with a nitride red-light phosphor. As seen from FIG. 2, FIG. 5 and FIG. 6, compared with a traditional light-emitting diode adopting a blue light chip and green and red phosphors, a difference of the spectrum of the light-emitting diode 10 (including the multi-color light emitting chip 13 and the phosphor-containing layer 15 containing a red-light phosphor) of the illustrated embodiment is that: a spectral full width half maximum in the wavelength range of green light in the illustrated embodiment is about 30 nm (less than 50 nm), while a conventional narrowest spectral full width half maximum of green phosphor is more than 50 nm, and therefore the light-emitting diode 10 of the illustrated embodiment acting as a backlight source and combining with red (R), green (G) and blue (B) three-primary-color filters (see FIG. 7) of a display panel in a backlight-type display device can achieve a NTSC level up to 103% (corresponding to the KSF red-light phosphor) or 92% (corresponding to the nitride red-light phosphor). For example, a wavelength range achieved by a red-light phosphor in the illustrated embodiment is: (a) KSF red-light phosphor, 630 nm~632 nm; (b) nitride red-light phosphor, 620 nm~660 nm; or (c) NBR red-light phosphor, 620 nm~640 nm.

In terms of advantages of using only one kind of phosphor in the light-emitting diode 10, specific weights of phosphors of different materials are significantly different, a specific weight of yellow/green light phosphor is 1.5~3 times of a specific weight of red-light phosphor, and when being mixed into a silicone, the phosphor would begin to precipitate slowly due to inconsistent specific weight. In an actual production process, based on a consideration of production efficiency, a time for preparing one tube of phosphor is approximately 1 hour, the precipitation of phosphor would cause slight changes in proportion of phosphors in light-emitting diodes produced in one batch, directly resulting in significant differences of color coordinates (x, y). Contradistinctively, the red-light phosphor has a relatively small specific weight, and can increase a concentration degree of drop points of color coordinate (x, y) of the phosphor-containing layer 15.

| Yellow/green light phosphor | LuAG | GaYAG | YAG | Silicate | β-SiAlON |
|---|---|---|---|---|---|
| Specific weight (g/cm$^3$) | 6 | 5 | 4.8 | 4.7 | 3.2 |

| Red-light phosphor | SCASN | CASN | BSSN | KSF | NBR |
|---|---|---|---|---|---|
| Specific weight (g/cm$^3$) | 3.8 | 3.2 | 3.1 | 2.75 | 3.13 |

In summary, the light-emitting diode 10 of the illustrated embodiment adopts the multi-color light emitting chip 13, the multi-color light emitting chip 13 includes the first peak Wp1 in the wavelength range of the first primary-color light (such as blue light) and the second peak Wp2 in the wavelength range of the second primary-color light (such as green light), and the absolute value of the wavelength difference between the first peak and the second peak is greater than 50 nm, so that RGB three-primary-color lights can be outputted by using a single-color light phosphor (such as red-light phosphor) with relatively high reliability. Moreover, if the light-emitting diode 10 combines RGB three-primary-color filters to be applied into a backlight-type display device such as a liquid crystal display device, a high NTSC level can be achieved.

Second Embodiment

Figure 8A:
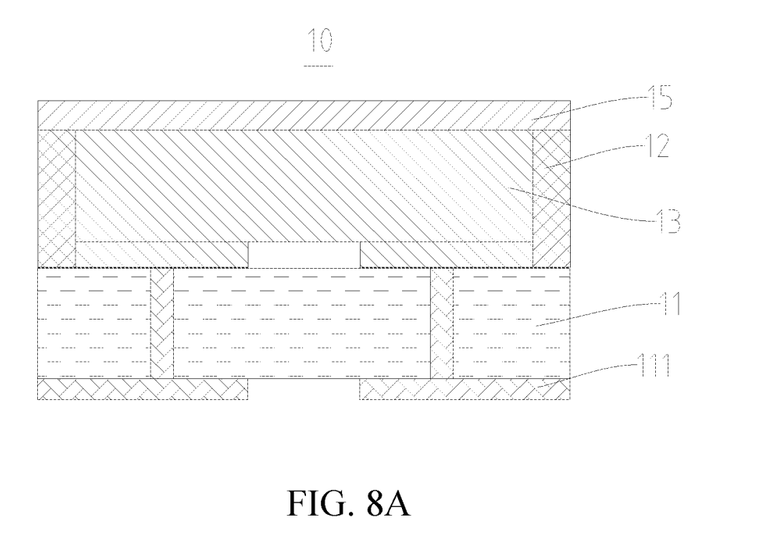
FIG. 8A is a schematic structural view of a light-emitting diode according to a second embodiment of the disclosure.

Referring to FIG. 8A, the second embodiment of the disclosure provides a light-emitting diode 10. For example, the light-emitting diode 10 includes a packaging substrate 11, a white glue 12, a multi-color light emitting chip 13, and a phosphor-containing layer (also referred to as wavelength conversion layer) 15.

The packaging substrate 11 exemplarily includes a base (such as ceramic base) and a circuit structure 111 arranged on the base. Concretely speaking, the circuit structure 111 includes a positive electrode and a negative electrode arranged on a bottom surface of the base, and a plurality of vias penetrating through the base and being electrically connected to the positive and negative electrodes respectively.

The multi-color light emitting chip 13 is arranged on the packaging substrate 11 and electrically connected to the circuit structure 111 of the packaging substrate 11. Specially speaking, the multi-color light emitting chip 13 is exemplarily single light-emitting diode chip, so that the light-emitting diode 10 is a single-chip device. The multi-color light emitting chip 13 is a flip chip, a P-electrode and an N-electrode thereof are arranged on a top surface of the base of the packaging substrate 111 and electrically connected to the plurality of vias respectively, so as to realize electrical connections with the positive electrode and the negative electrode. Of course, it can be understood that the light-emitting diode 10 of the illustrated embodiment may adopt a plurality of the multi-color light emitting chips 13 instead in other embodiment to form a multi-chip device. Specific layer structures, specific functions and an emission spectrum of the multi-color light emitting chip 13 can refer to the related description in the first embodiment mentioned above, and thus will not be repeated herein.

The phosphor-containing layer 15 is arranged on the packaging substrate 11 and acts as a wavelength conversion element. The phosphor-containing layer 15 is disposed covering the multi-color light emitting chip 13 and can be excited to emit light such as emit red light. Specifically speaking, the phosphor-containing layer 15 is located at a side of the multi-color light emitting chip 13 facing away from the packaging substrate 11, and the white glue 12 is arranged around (e.g., on four side surfaces of) the multi-color light emitting chip 13, so as to realize light output from only the top surface of the light-emitting diode 10 and thereby obtain a CSP structure of single-sided light output. Furthermore, the phosphor-containing layer 15 of the illustrated embodiment is typically a mixture of a transparent glue and a phosphor. The transparent glue is exemplarily a silicone (with high light transmittance to visible light), and the phosphor is exemplarily a red-light phosphor. In addition, it is noted that, the white glue 12 can be commercially available KER2020 milky silicone, which has a low transmittance to visible light, and of course, it can be a Dam glue of other suitable material instead.

Figure 8B:
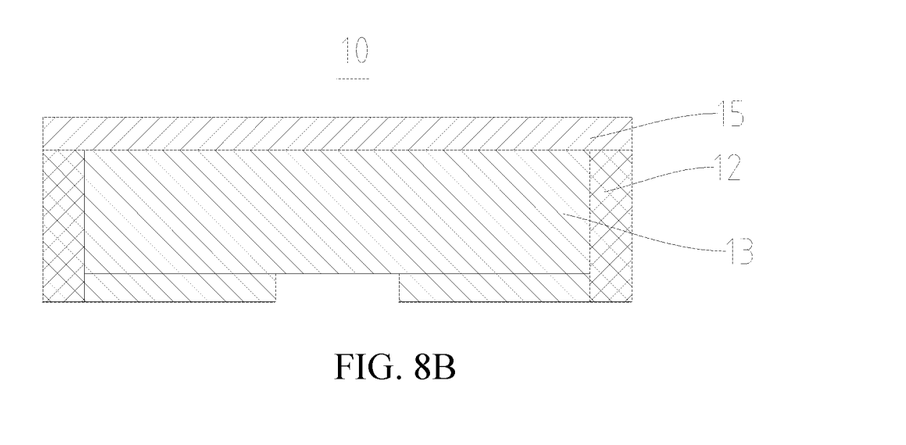
FIG. 8B a schematic structural view of another light-emitting diode according to the second embodiment of the disclosure.

It is indicated that, in other embodiment, as shown in FIG. 8B, the light-emitting diode 10 may not be equipped with the packaging substrate 11. For example, the white glue 12, the multi-color light emitting chip 13 and the phosphor-containing layer 15 are firstly formed on a temporary/removable substrate, and the removable substrate then is removed to obtain the light-emitting diode 10 shown in FIG. 8B.

Third Embodiment

Figure 9:
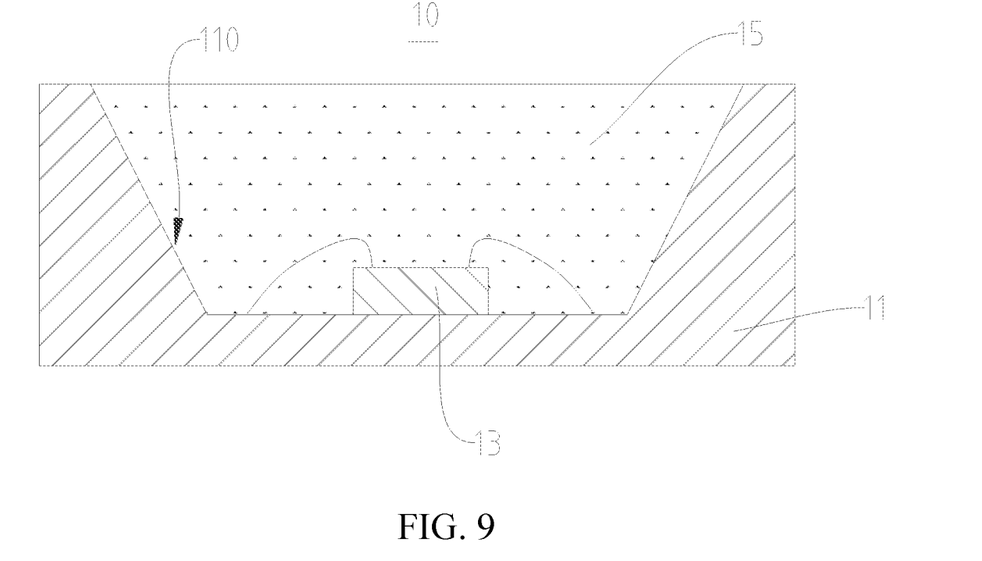
FIG. 9 is a schematic structural view of a light-emitting diode according to a third embodiment of the disclosure.

Referring to FIG. 9, the third embodiment of the disclosure provides a light-emitting diode 10. The light-emitting diode 10 as provided is different from the CSP form of mini-LED backlight route described in the first and second embodiments, and employs a surface-mounted (SMT) form. The light-emitting diode 10 exemplarily includes a packaging substrate 11, a multi-color light emitting chip 13, and a phosphor-containing layer (also referred to as wavelength conversion layer) 15.

The packaging substrate 11 is formed with a recessed region 110. The recessed region 110 is exemplarily a ceramic base or a metal base provided with a circuit structure.

The multi-color light emitting chip 13 is arranged in the recessed region 110 of the packaging substrate 11 and electrically connected to the circuit structure on the packaging substrate 11. Specifically speaking, the multi-color light emitting chip 13 is, for example, single light-emitting diode chip, so that the light-emitting diode 10 is a single-chip device. The multi-color light emitting chip 13 is a lateral chip, and a P-electrode and an N-electrode thereof are electrically connected to the packaging substrate 11 by wire bonding in the recessed region 110 of the packaging substrate 11. Of course, it can be understood that the light-emitting diode 10 of the illustrated embodiment may adopt a plurality of the multi-color light emitting chip 13 instead in other embodiment to form a multi-chip device. Specific layer structures, specific functions and an emission spectrum of the multi-color light emitting chip 13 can refer to the related description in the first embodiment mentioned above, and thus will not be repeated herein.

The phosphor-containing layer 15 is arranged on the packaging substrate 11 and acts as a wavelength conversion element. The phosphor-containing layer 15 is disposed covering/over the multi-color light emitting chip 13 and can be excited to emit light such as emit red light. Specifically speaking, the phosphor-containing layer 15 is filled in the recessed region 110 to cover the multi-color light emitting chip 13. Furthermore, the phosphor-containing layer 15 of the illustrated embodiment is typically a mixture of a transparent glue and a phosphor. For example, the transparent glue is exemplarily a silicone (with a high transmittance to visible light), and the phosphor is exemplarily a red-light phosphor.

Fourth Embodiment

Figure 10:
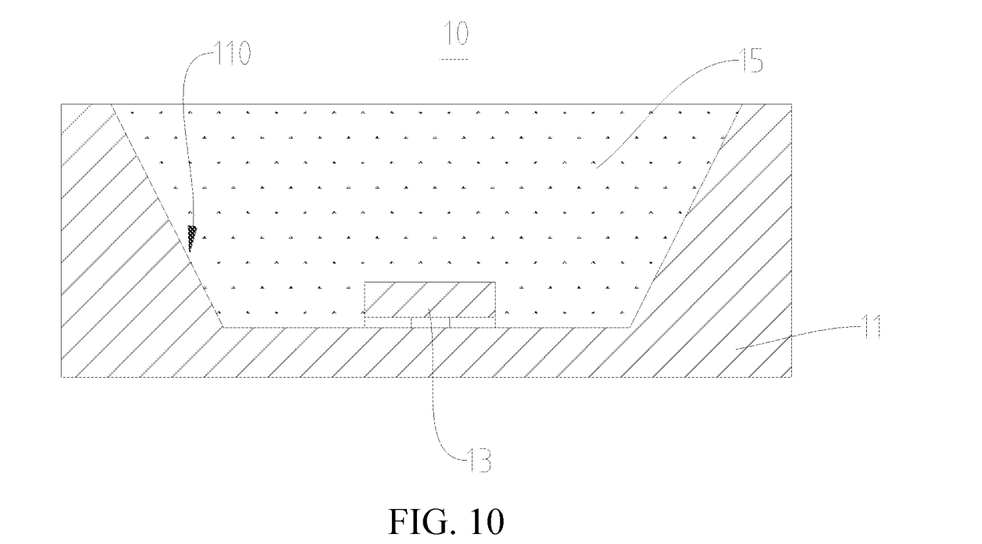
FIG. 10 is a schematic structural view of a light-emitting diode according to a fourth embodiment of the disclosure.

Referring to FIG. 10, the fourth embodiment of the disclosure provides a light-emitting diode 10. The light-emitting diode 10 is a surface-mounted (SMT) LED. The light-emitting diode 10 exemplarily includes a packaging substrate 11, a multi-color light emitting chip 13, and a phosphor-containing layer (also referred to as wavelength conversion layer) 15.

The packaging substrate 11 is formed with a recessed region 110. The packaging substrate 11 is exemplarily a ceramic base provided with a circuit structure.

The multi-color light emitting chip 13 is arranged in the recessed region 110 of the packaging substrate 11, and the multi-color light emitting chip 13 is electrically connected to the circuit structure on the packaging substrate 11. Specifically speaking, the multi-color light emitting chip 13 is exemplarily single light-emitting diode chip, so that the light-emitting diode 10 is a single-chip device. The multi-color light emitting chip 13 is a flip chip, a P-electrode and an N-electrode thereof are electrically connected to the circuit structure of the packaging substrate 11 through solders in the recessed region 110 of the packaging substrate 11. However, it can be understood that the light-emitting diode 10 of the illustrated embodiment can adopt a plurality of the multi-color light emitting chips 13 instead in other embodiment to form a multi-chip device. Specific layer structures, specific functions and an emission spectrum of the multi-color light emitting chip 13 can refer to the related description in the first embodiment mentioned above, and thus will not be repeated herein.

The phosphor-containing layer 15 is arranged on the packaging substrate 11 and acts as a wavelength conversion element. The phosphor-containing layer 15 is disposed covering the multi-color light emitting chip 13 and can be excited to emit light such as emit red light. Specifically, the phosphor-containing layer 13 is filled in the recessed region 110 to cover the multi-color light emitting chip 13. Furthermore, the phosphor-containing layer 15 of the illustrated embodiment is typically a mixture of a transparent glue and a phosphor. For example, the transparent glue is exemplarily a silicone (with a high transmittance to visible light), and the phosphor is exemplarily a red-light phosphor.

Fifth Embodiment

Figure 11:
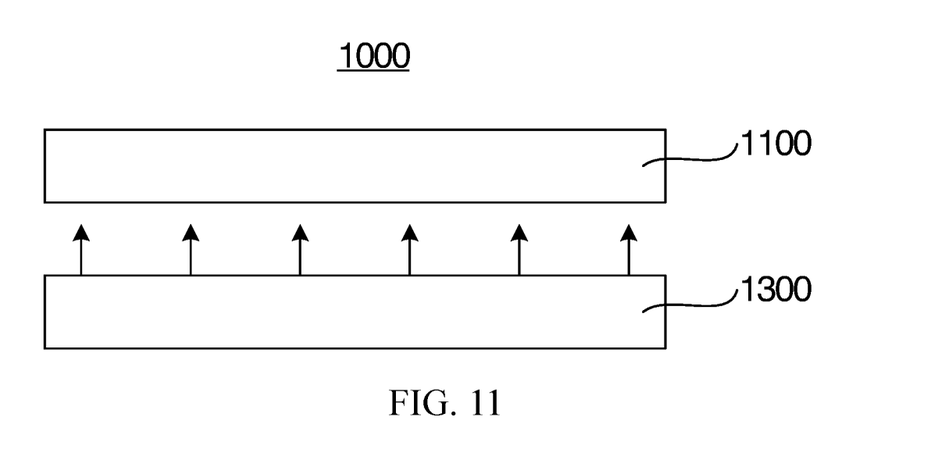
FIG. 11 is a schematic structural view of a backlight-type display device according to a fifth embodiment of the disclosure.

Referring to FIG. 11, the fifth embodiment of the disclosure provides a backlight-type display device 1000. The backlight-type display device 1000 exemplarily includes a display panel 1100 and a backlight module 1300.

Figure 12:
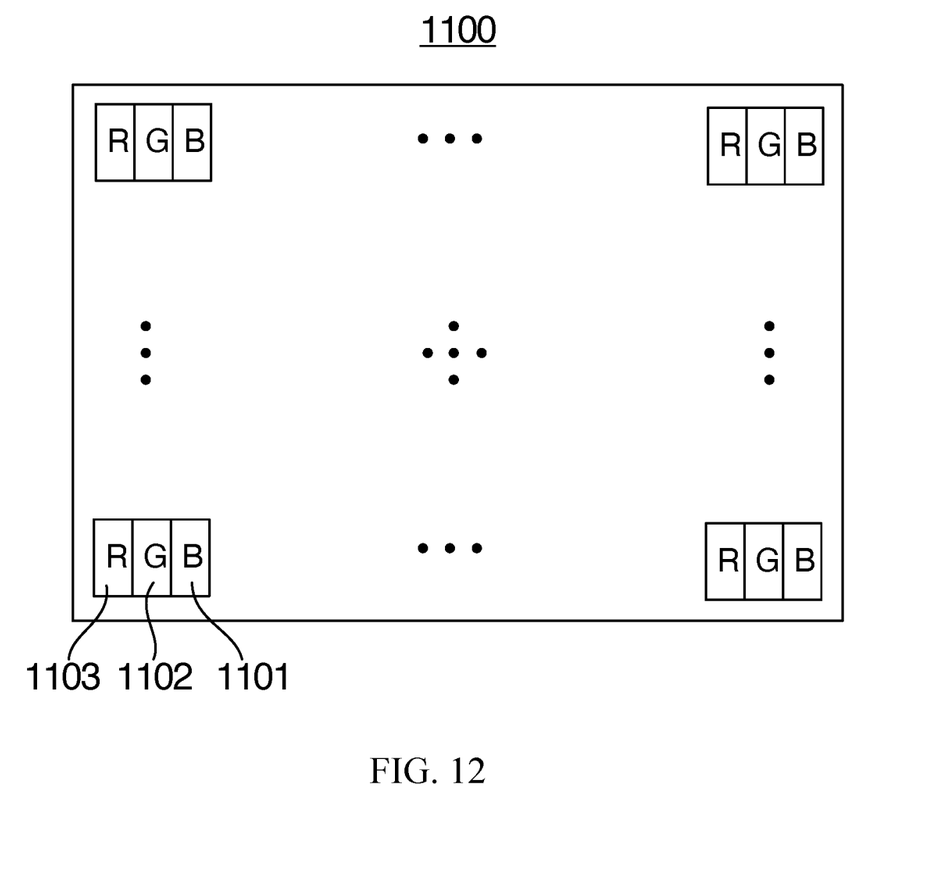
FIG. 12 is a schematic view of an arrangement of filters in a display panel shown in FIG. 11.

As seen from FIG. 11 and FIG. 12, the display panel 1100 includes a first primary-color filter 1101, a second primary-color filter 1102, and a third primary-color filter 1103. The first primary-color filter 1101, the second primary-color filter 1102 and the third primary-color filter 1103 respectively are, for example, a blue filter B, a green filter G and a red filter R as shown in FIG. 12, but the embodiment of the disclosure is not limited to the illustration. Furthermore, the display panel 1100 is exemplarily a non-self-emissive liquid crystal display panel.

The backlight module 1300 is used to provide backlight illumination to the display panel 1100. The backlight module 1300 is provided with the light-emitting diode(s) 10 as described in one or more embodiments in the first through fourth embodiments. Correspondingly, the first primary-color filter 1101, the second primary-color filter 1102 and the third primary-color filter 1103 of the display panel 1100 are configured for filtering the first primary-color light (such as blue light), the second primary-color light (such as green light) and the third primary-color light (such as red light) respectively. More specifically, the backlight module 1300 can be a side-type backlight module, or a direct-type backlight module. In terms of the side-type backlight module, the backlight module 1300 exemplarily includes: one or more the light-emitting diodes 10, a light guide plate, and optical films such as a diffuser and so on. In terms of the direct-type backlight module, the backlight module 1300 exemplarily includes a plurality of the light-emitting diodes 10 arranged in an array, and optical films such as a diffuser and so on.

In addition, it can be understood that the embodiments mentioned above are only illustrative description of the disclosure, and the technical solutions of the embodiments can be arbitrarily combined and used together on the premise that the technical features are not conflicting, the structures are not contradictory, and the inventive purpose of the disclosure is not violated.

Finally, it should be noted that the above embodiments are only used to illustrate the technical solutions of the disclosure, rather than to limit the disclosure. Although the disclosure has been described in detail with reference to the foregoing embodiments, those of ordinary skill in the art should understand that the technical solutions illustrated in the foregoing embodiments may be modified, or some of the technical features may be equivalently substituted. These modifications or substitutions do not make the essence of corresponding technical solutions deviate from the spirit and scope of the technical solutions of various embodiments of the disclosure.

What is claimed is:

1. A light-emitting diode, comprising:
   a multi-color light emitting chip, wherein an emission spectrum of the multi-color light emitting chip comprises a first peak in a wavelength range of a first primary-color light and a second peak in a wavelength range of a second primary-color light, and an absolute value of a wavelength difference between the first peak and the second peak is greater than 50 nanometers (nm); and
   a phosphor-containing layer, disposed over the multi-color light emitting chip and configured to be excited to emit a third primary-color light, wherein colors of the third primary-color light, the second primary-color light and the first primary-color light are different from one another;
   wherein an intensity of the first peak is greater than an intensity of the second peak, and a ratio of the intensity of the first peak to the intensity of the second peak is in a range of 5/3~5; a spectral full width half maximum (FWHM) of the emission spectrum corresponding to the first peak and a spectral full width half maximum of the emission spectrum corresponding to the second peak each are less than 50 nm, and the spectral full width half maximum of the emission spectrum corresponding to the first peak is smaller than the spectral full width half maximum of the emission spectrum corresponding to the second peak.

2. The light-emitting diode as claimed in claim 1, wherein a wavelength of the first peak is in a range of 430 nm-470 nm, and a wavelength of the second peak is in a range of 515 nm-535 nm.

3. The light-emitting diode as claimed in claim 1, wherein the spectral full width half maximum of the emission spectrum corresponding to the first peak is in a range of 15 nm~25 nm, and the spectral full width half maximum of the emission spectrum corresponding to the second peak is in a range of 25 nm~45 nm.

4. The light-emitting diode as claimed in claim 1, wherein the multi-color light emitting chip comprises an N-type semiconductor layer, a P-type semiconductor layer, and a multiple quantum well layer structure located between the N-type semiconductor layer and the P-type semiconductor layer; the multiple quantum well layer structure comprises a first well layer and a second well layer arranged along a distance direction of the N-type semiconductor layer and the P-type semiconductor layer, the first well layer and the well layer have different band gaps and are for emitting the first primary-color light and the second primary-color light respectively.

5. The light-emitting diode as claimed in claim 4, wherein a material of each of the first well layer and the second well layer comprises indium gallium nitride, and a concentration of indium in the first well layer is different from a concentration of indium in the second well layer; the concentration of indium in the first well layer is in a concentration range of 12.4%~18.8%, and the concentration of indium in the second well layer is in a concentration range of 25.2%~27.8%.

6. The light-emitting diode as claimed in claim 1, wherein the light-emitting diode is a chip-scale packaged single-chip device, and the multi-color light emitting chip is a flip chip;
   wherein the phosphor-containing layer is located on a top surface of the flip chip and arranged around the flip chip, so as to realize light output from side surfaces as well as the top surface of the light-emitting diode; or, wherein the phosphor-containing layer is located on the top surface of the flip chip and a white glue is arranged around the flip chip, so as to realize light output from only the top surface of the light-emitting diode.

7. The light-emitting diode as claimed in claim 1, wherein the light-emitting diode is surface-mounted single-chip device and further includes a packaging substrate, and the packaging substrate is formed with a recessed region; the multi-color light emitting chip is arranged in the recessed region and electrically connected to the packaging substrate, the phosphor-containing layer is filled in the recessed region to cover the multi-color light emitting chip.

8. A backlight-type display device, comprising:
a display panel, comprising a first primary-color filter, a second primary-color filter and a third primary-color filter; and
a backlight module, configured for providing backlight illumination to the display panel;
wherein the backlight module is provided with a light-emitting diode comprising:
a multi-color light emitting chip, wherein an emission spectrum of the multi-color light emitting chip comprises a first peak in a wavelength range of a first primary-color light and a second peak in a wavelength range of a second primary-color light, and an absolute value of a wavelength difference between the first peak and the second peak is greater than 50 nm; wherein an intensity of the first peak is greater than an intensity of the second peak, a ratio of the intensity of the first peak to the intensity of the second peak is in a range of 5/3~5; a spectral full width half maximum (FWHM) of the emission spectrum corresponding to the first peak and a spectral full width half maximum of the emission spectrum corresponding to the second peak each are less than 50 nm, and the spectral full width half maximum of the emission spectrum corresponding to the first peak is smaller than the spectral full width half maximum of the emission spectrum corresponding to the second peak; and
a phosphor-containing layer, disposed over the multi-color light emitting chip and configured to be excited to emit a third primary-color light, wherein colors of the third primary-color light, the second primary-color light and the first primary-color light are different from one another;
wherein the first primary-color filter, the second primary-color filter and the third primary-color filter are configured for filtering the first primary-color light, the second primary-color light and the third primary-color light respectively.

9. The backlight-type display device as claimed in claim 8, wherein a wavelength of the first peak is in a range of 430 nm~470 nm, and a wavelength of the second peak is in a range of 515 nm~535 nm.

10. The backlight-type display device as claimed in claim 8, wherein the spectral full width half maximum of the emission spectrum corresponding to the first peak is in a range of 15 nm~25 nm, and the spectral full width half maximum of the emission spectrum corresponding to the second peak is in a range of 25 nm~45 nm.

11. The backlight-type display device as claimed in claim 8, wherein the multi-color light emitting chip comprises an N-type semiconductor layer, a P-type semiconductor layer, and a multiple quantum well layer structure located between the N-type semiconductor layer and the P-type semiconductor layer; the multiple quantum well layer structure comprises a first well layer and a second well layer arranged along a distance direction of the N-type semiconductor layer and the P-type semiconductor layer, the first well layer and the well layer have different band gaps and are for emitting the first primary-color light and the second primary-color light respectively.

12. The backlight-type display device as claimed in claim 11, wherein a material of each of the first well layer and the second well layer comprises indium gallium nitride, and a concentration of indium in the first well layer is different from a concentration of indium in the second well layer; the concentration of indium in the first well layer is in a concentration range of 12.4%~18.8%, and the concentration of indium in the second well layer is in a concentration range of 25.2%~27.8%.

13. The backlight-type display device as claimed in claim 8, wherein the light-emitting diode is a chip-scale packaged single-chip device, and the multi-color light emitting chip is a flip chip;
wherein the phosphor-containing layer is located on a top surface of the flip chip and arranged around the flip chip, so as to realize light output from side surfaces as well as the top surface of the light-emitting diode; or, wherein the phosphor-containing layer is located on the top surface of the flip chip and a white glue is arranged around the flip chip, so as to realize light output from only the top surface of the light-emitting diode.

14. The backlight-type display device as claimed in claim 8, wherein the light-emitting diode is surface-mounted single-chip device and further includes a packaging substrate, and the packaging substrate is formed with a recessed region; the multi-color light emitting chip is arranged in the recessed region and electrically connected to the packaging substrate, the phosphor-containing layer is filled in the recessed region to cover the multi-color light emitting chip.

15. The light-emitting diode as claimed in claim 1, wherein the multi-color light emitting chip is a single LED chip and comprises a multiple quantum well layer structure including a first well layer and a second well layer stacked together, a concentration of indium in the first well layer is in a concentration range of 12.4%~18.8%, a concentration of indium in the second well layer is in a concentration range of 25.2%~27.8%, the first well layer and the second well layer are configured for emitting blue light and green light respectively, a wavelength of the first peak is in a range of 430 nm~470 nm, and a wavelength of the second peak is in a range of 515 nm~535 nm.

16. The light-emitting diode as claimed in claim 15, wherein the ratio of the intensity of the first peak to the intensity of the second peak is in a range of 2~5; the spectral full width half maximum of the emission spectrum corresponding to the first peak is in a range of 15 nm~25 nm, and the spectral full width half maximum of the emission spectrum corresponding to the second peak is in a range of 25 nm~45 nm.

17. The backlight-type display device as claimed in claim 8, wherein the multi-color light emitting chip is a single LED chip and comprises a multiple quantum well layer structure including a first well layer and a second well layer stacked together, a concentration of indium in the first well layer is in a concentration range of 12.4%~18.8%, a concentration of indium in the second well layer is in a concentration range of 25.2%~27.8%, the first well layer and the second well layer are configured for emitting blue light and green light respectively, a wavelength of the first peak is in a range of 430 nm~470 nm, and a wavelength of the second peak is in a range of 515 nm~535 nm.

18. The light-emitting diode as claimed in claim 17, wherein the ratio of the intensity of the first peak to the intensity of the second peak is in a range of 2~5; the spectral full width half maximum of the emission spectrum corresponding to the first peak is in a range of 15 nm~25 nm, and the spectral full width half maximum of the emission spectrum corresponding to the second peak is in a range of 25 nm~45 nm.

* * * * *